United States Patent
Ahn et al.

(10) Patent No.: US 11,696,463 B2
(45) Date of Patent: Jul. 4, 2023

(54) DISPLAY PANEL AND METHOD OF MANUFACTURING THE SAME

(71) Applicant: Samsung Display Co., Ltd., Yongin-Si (KR)

(72) Inventors: Jaeheon Ahn, Hwaseong-si (KR); Jangsoo Kim, Asan-si (KR); Kyounghae Min, Asan-si (KR); Seok-Joon Hong, Seongnam-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 197 days.

(21) Appl. No.: 17/168,229

(22) Filed: Feb. 5, 2021

(65) Prior Publication Data
US 2021/0376020 A1 Dec. 2, 2021

(30) Foreign Application Priority Data

May 27, 2020 (KR) .................. 10-2020-0063350

(51) Int. Cl.
*H01L 27/32* (2006.01)
*H01L 51/56* (2006.01)
(Continued)

(52) U.S. Cl.
CPC ......... *H10K 50/8428* (2023.02); *G02B 5/201* (2013.01); *G02F 1/13394* (2013.01);
(Continued)

(58) Field of Classification Search
CPC . G02F 1/1339–13398; G02F 1/133509; G02F 1/133512; G02F 1/133514;
(Continued)

(56) References Cited

U.S. PATENT DOCUMENTS 7,515,225 B2 * 4/2009 Park ................. G02F 1/1333
349/144
10,558,074 B2 2/2020 Chu et al.
(Continued)

FOREIGN PATENT DOCUMENTS

CN 110289366 A * 9/2019 ........... H01L 27/322
CN 209606742 U * 11/2019 ........... G02F 1/1335
(Continued)

OTHER PUBLICATIONS

Machine translation, Lee, Korean Pat. Pub. No. KR-20060134760A, translation date: Oct. 14, 2022, Espacenet, all pages. (Year : 2022).*

(Continued)

*Primary Examiner* — Victoria K. Hall
(74) *Attorney, Agent, or Firm* — Innovation Counsel LLP

(57) ABSTRACT

A display panel includes an upper display substrate including a first pixel area, a second pixel area, a third pixel area, and a light blocking area surrounding the first, second, and third pixel areas and a lower display substrate including a light emitting element. The upper display substrate includes a base substrate, a first bank overlapping the light blocking area and disposed on the base substrate, a second bank overlapping the light blocking area and disposed on the base substrate, a bridge bank disposed on the base substrate between the first bank and the second bank, and an organic material pattern at least a portion of which is disposed on the bridge bank forming a column spacer. The display panel has improved reliability.

20 Claims, 14 Drawing Sheets

(51) Int. Cl.
| | |
|---|---|
| *H10K 50/842* | (2023.01) |
| *G02B 5/20* | (2006.01) |
| *G02F 1/1335* | (2006.01) |
| *G02F 1/1339* | (2006.01) |
| *H10K 50/86* | (2023.01) |
| *H10K 59/38* | (2023.01) |
| *H10K 59/122* | (2023.01) |
| *H10K 71/00* | (2023.01) |
| *H10K 59/35* | (2023.01) |
| *H10K 102/00* | (2023.01) |

(52) U.S. Cl.
CPC .... *G02F 1/13398* (2021.01); *G02F 1/133512* (2013.01); *G02F 1/133514* (2013.01); *H10K 50/865* (2023.02); *H10K 59/122* (2023.02); *H10K 59/38* (2023.02); *H10K 71/00* (2023.02); *H10K 59/353* (2023.02); *H10K 2102/331* (2023.02)

(58) Field of Classification Search
CPC .............. H01L 51/525; H01L 51/5281; H01L 51/5284; H01L 27/322
See application file for complete search history.

(56) References Cited

U.S. PATENT DOCUMENTS

| | | | |
|---|---|---|---|
| 2003/0104291 A1* | 6/2003 | Yi | G02B 5/201 430/7 |
| 2003/0128309 A1* | 7/2003 | Yamada | G02F 1/13394 349/106 |
| 2005/0128382 A1* | 6/2005 | Baek | G02F 1/13394 349/106 |
| 2005/0134788 A1* | 6/2005 | Park | G02F 1/1333 349/158 |
| 2005/0151909 A1* | 7/2005 | Yagi | G02F 1/133514 349/138 |
| 2005/0179853 A1* | 8/2005 | Chen | G02F 1/13394 349/155 |
| 2006/0238694 A1* | 10/2006 | Chen | G02F 1/13394 349/156 |
| 2007/0229734 A1* | 10/2007 | Ho | G02F 1/13394 349/106 |
| 2007/0247584 A1* | 10/2007 | Li | G02F 1/13394 349/156 |
| 2012/0120337 A1* | 5/2012 | Ji | G02F 1/13394 445/24 |
| 2014/0253856 A1* | 9/2014 | Nakahata | H01L 27/3244 438/34 |
| 2014/0307208 A1* | 10/2014 | Hatakeyama | G02F 1/133351 349/110 |
| 2014/0368766 A1* | 12/2014 | Shibata | G02F 1/133617 349/61 |
| 2015/0002774 A1* | 1/2015 | Choi | C08F 220/281 438/151 |
| 2015/0301241 A1* | 10/2015 | Zhang | G02B 5/201 427/164 |
| 2015/0309221 A1* | 10/2015 | Li | G02B 5/201 359/891 |
| 2015/0325592 A1* | 11/2015 | Jia | H01L 27/124 257/72 |
| 2015/0340655 A1* | 11/2015 | Lee | H01L 27/3211 257/40 |
| 2017/0038630 A1* | 2/2017 | Chen | G02F 1/133512 |
| 2017/0102574 A1* | 4/2017 | Kim | G02F 1/1368 |
| 2019/0121185 A1* | 4/2019 | Liu | G02F 1/133351 |
| 2019/0129211 A1* | 5/2019 | Kim | G02F 1/13439 |
| 2019/0317363 A1* | 10/2019 | Shiau | G02F 1/133516 |
| 2021/0088835 A1* | 3/2021 | Wen | G02F 1/13394 |
| 2021/0364840 A1* | 11/2021 | Cao | G03F 1/32 |
| 2022/0199939 A1* | 6/2022 | Gao | H01L 51/5246 |

FOREIGN PATENT DOCUMENTS

| | | | | |
|---|---|---|---|---|
| CN | 209606742 U | * | 11/2019 | .......... G02F 1/1335 |
| CN | 110928027 A | * | 3/2020 | ....... G02F 1/133512 |
| JP | 2006-072176 A | | 3/2006 | |
| JP | 2006252988 A | | 9/2006 | |
| JP | 2010-287421 | * | 12/2010 | .......... H01L 51/524 |
| JP | 2010-287421 A | * | 12/2010 | .......... H01L 51/524 |
| JP | 2010287421 A | | 12/2010 | |
| KR | 1020060053498 A | * | 5/2006 | ....... G02F 1/133345 |
| KR | 1020060134760 A | * | 12/2006 | |
| KR | 10-2017-0124122 A | | 11/2017 | |
| KR | 10-2021-0122406 A | | 10/2021 | |

OTHER PUBLICATIONS

Machine translation, Maeng, Korean Pat. Pub. No. KR-20060053498A, translation date: Oct. 14, 2022, Espacenet, all pages. (Year: 2022).*
Machine translation, Zhang, Chinese Pat. Pub. No. CN209606742U, translation date: Oct. 13, 2022, Espacenet, all pages. (Year: 2022).*
Machine translation, Luo, Chinese Pat. Pub. No. CN110289366A, translation date: Oct. 12, 2022, Espacenet, all pages. (Year: 2022).*
Machine translation, Nakamura, Japanese Pat. Pub. No. JP2010287421A, translation date: Oct. 11, 2022, Espacenet, all pages. (Year: 2022).*
Machine translation, Zhu, Chinese Pat. Pub. No. CN110928027A, translation date: Oct. 12, 2022, Espacenet, all pages. (Year: 2022).*
Extended European Search Report, Application No. 21174235.8 dated Nov. 9, 2021, 8 pages.

\* cited by examiner

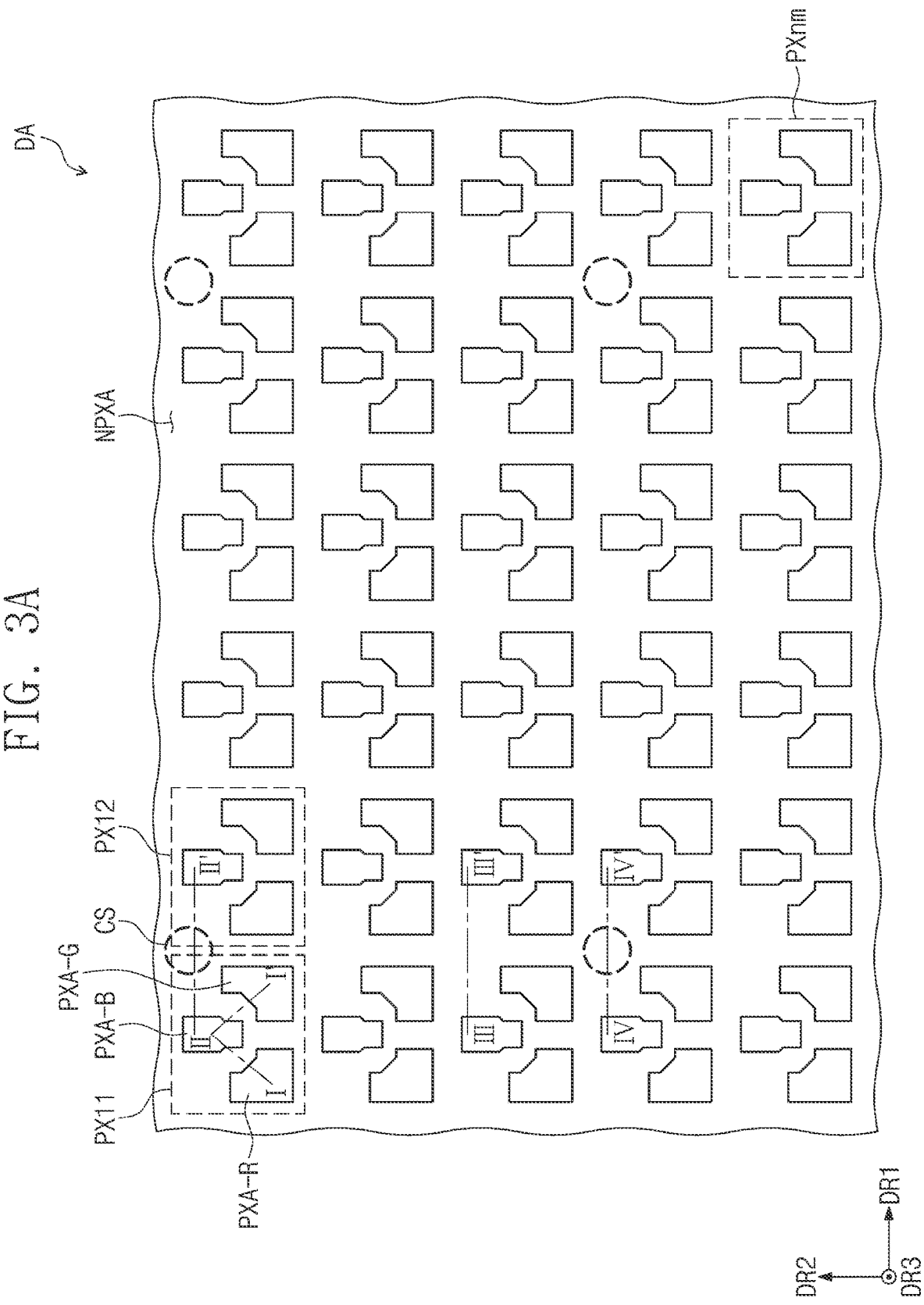

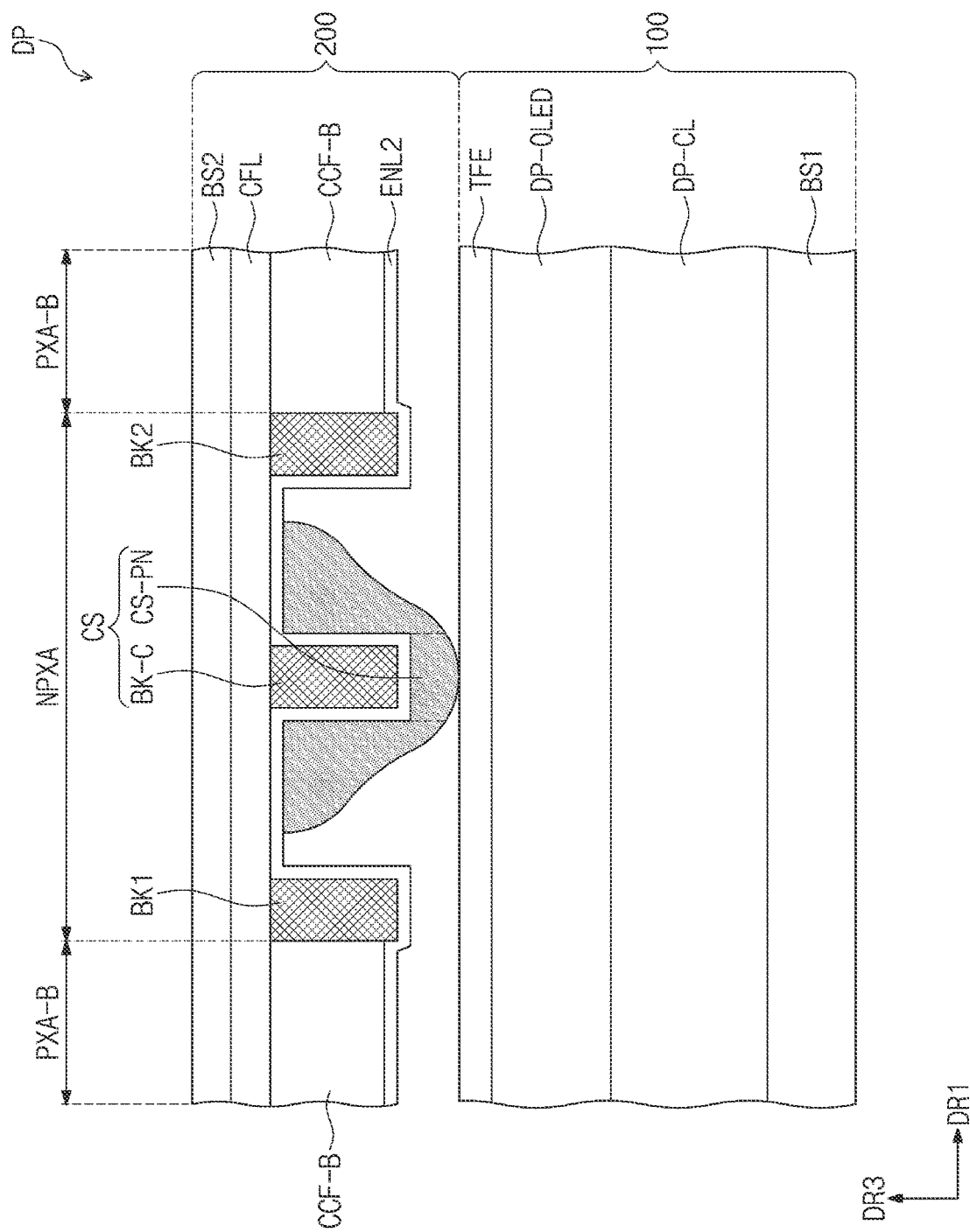

DISPLAY PANEL AND METHOD OF MANUFACTURING THE SAME

CROSS-REFERENCE TO RELATED APPLICATION

This U.S. non-provisional patent application claims priority under 35 U.S.C. § 119 to Korean Patent Application No. 10-2020-0063350 filed on May 27, 2020, the contents of which are hereby incorporated by reference in its entirety.

BACKGROUND

1. Field of Disclosure

The present disclosure relates to a display panel and a method of manufacturing the display panel. More particularly, the present disclosure relates to a display panel including a bank and a method of manufacturing the display panel.

2. Description of the Related Art

A display device presents images to a user. The images of the display device are provided using a source light generated by a display panel. The display panel includes a first display substrate generating the source light and a second display substrate controlling colors of the source light.

The display device includes a column spacer to maintain a gap between the first display substrate and the second display substrate.

SUMMARY

The present disclosure provides a display panel having improved reliability.

The present disclosure provides a method of manufacturing the display panel having the improved reliability.

Embodiments of the inventive concept provide a display panel including an upper display substrate including a first pixel area, a second pixel area, a third pixel area, and a light blocking area surrounding the first, second, and third pixel areas and a lower display substrate including a light emitting element. The upper display substrate includes a base substrate, a first bank overlapping the light blocking area and disposed on the base substrate, a second bank overlapping the light blocking area and disposed on the base substrate, a bridge bank disposed on the base substrate between the first bank and the second bank, and an organic material pattern. At least a portion of the organic material pattern is disposed on the bridge bank.

The organic material pattern is disposed between the first bank and the second bank and covers the bridge bank.

The at least a portion of the organic material pattern disposed on the bridge bank overlaps the bridge bank in a plan view.

The display panel further includes a light control portion that overlaps the first pixel area and is disposed adjacent to the first bank in a plan view, and the light control portion includes at least one of a scattering particle and a quantum dot.

The organic material pattern overlaps the first bank, the bridge bank, and the second bank and does not overlap the light control portion.

The light control portion transmits a source light generated by the light emitting element or converts a wavelength of the source light.

A portion of the organic material pattern, which overlaps the bridge bank is disposed closest to the lower display substrate.

The display panel further includes a capping layer disposed between the bridge bank and the organic material pattern.

The organic material pattern includes at least one of a light blocking material and a resin.

The upper display substrate further includes a color filter layer disposed between the base substrate and the first bank, and the color filter layer includes a first color filter overlapping the first pixel area, a second color filter overlapping the second pixel area and transmitting light having a wavelength different from a wavelength of light transmitting through the first color filter, and a third color filter overlapping the third pixel area and transmitting light having a wavelength different from each of the wavelengths of the light transmitting through the first color filter and the second color filter.

The display panel further includes a third bank disposed on the base substrate, a fourth bank disposed on the base substrate, and a non-bridge bank disposed between the third bank and the fourth bank, and the non-bridge bank does not overlap the organic material pattern.

The display panel further includes a third bank disposed on the base substrate and a fourth bank disposed on the base substrate, the organic material pattern is disposed between the third bank and the fourth bank, and the organic material pattern has a height lower than a height of each of the third bank and the fourth bank.

The upper display substrate includes a display area that overlaps the first, the second, and the third pixel areas and a light blocking area; and a non-light-emitting area surrounding the display area. The organic material pattern overlaps the display area.

The light emitting element emits blue light.

The first pixel area, the second pixel area, and the third pixel area provide red light, green light, and blue light, respectively.

Embodiments of the inventive concept provide a method of manufacturing a display panel, comprising: preparing an upper display substrate; and preparing a lower display substrate; wherein the preparing the upper display substrate comprises: preparing a base substrate, forming a color filter layer on the base substrate, forming a plurality of banks on the color filter layer, forming a light control portion in an area corresponds to a pixel area disposed between adjacent banks; providing an organic composition on a bank disposed in a non-pixel area, and curing the organic composition to form an organic material pattern.

The method further includes forming a capping layer on the light control portion and the banks after the forming of the light control portion.

The organic composition includes at least one of a light blocking material and a resin.

The method further includes attaching the lower display substrate to the upper display substrate after the forming of the organic material pattern.

The lower display substrate includes a light emitting element and the light emitting element emits blue light.

According to the above, defects caused by mis-ejection of the ink composition may be prevented, and the gap between the lower display substrate and the upper display substrate may be maintained.

In addition, the reliability of the display panel may be improved through the manufacturing method of the display panel.

BRIEF DESCRIPTION OF THE DRAWINGS

The above and other advantages of the present disclosure will become readily apparent by reference to the following detailed description when considered in conjunction with the accompanying drawings wherein:

FIG. 3A is a plan view showing a display area of a display panel according to an exemplary embodiment of the present disclosure;

FIG. 6 is a cross-sectional view showing a display panel according to an exemplary embodiment of the present disclosure;

DETAILED DESCRIPTION

Figure 1A:
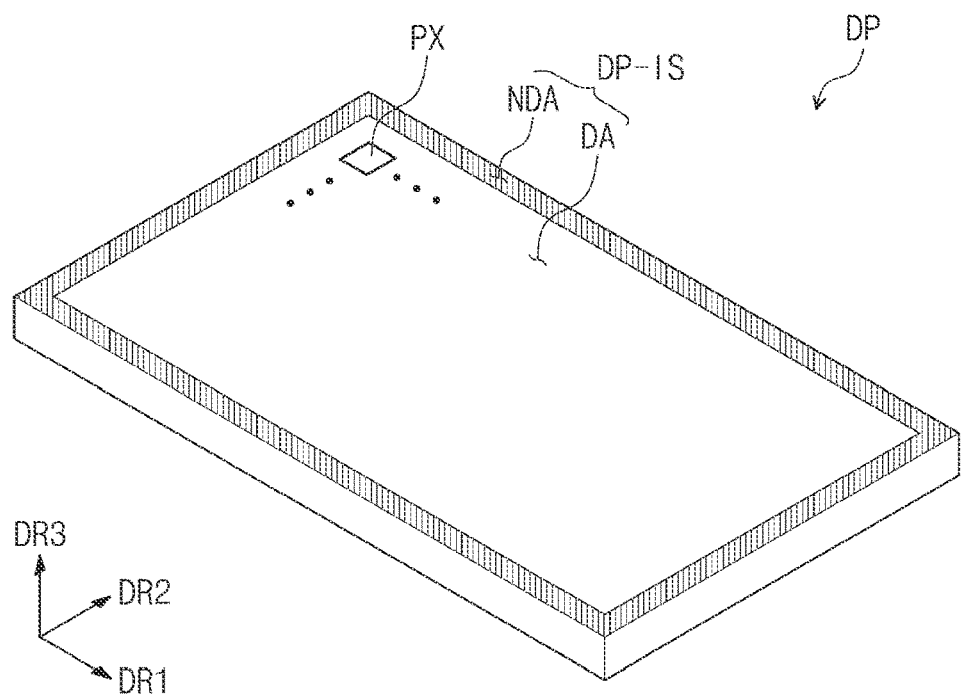
FIG. 1A is a perspective view showing a display panel according to an exemplary embodiment of the present disclosure.

The present disclosure may be variously modified and realized in many different forms, and thus specific embodiments will be exemplified in the drawings and described in detail hereinbelow. However, the present disclosure should not be limited to the specific disclosed forms, and be construed to include all modifications, equivalents, or replacements included in the spirit and scope of the present disclosure.

Like numerals refer to like elements throughout. In the drawings, the thickness, ratio, and dimension of components are exaggerated for effective description of the technical content. It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise.

It will be further understood that the terms "may include" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, exemplary embodiments of the present disclosure will be described with reference to accompanying drawings.

Figure 1B:
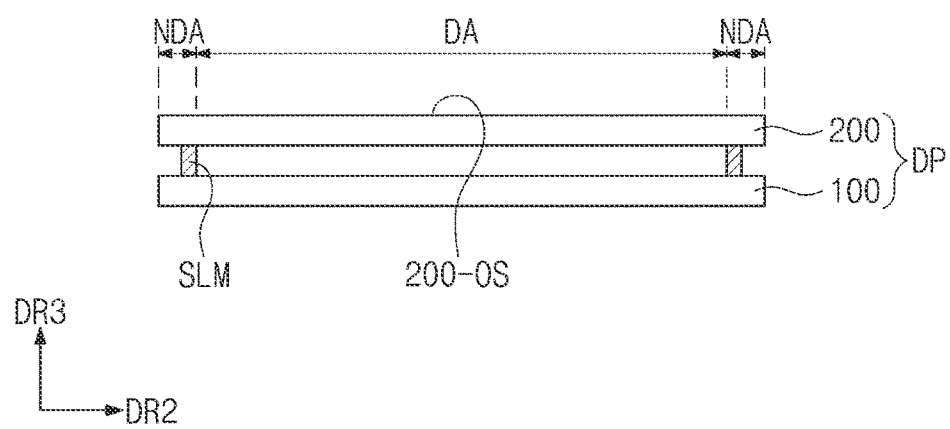
FIG. 1B is a cross-sectional view showing a display panel according to an exemplary embodiment of the present disclosure.
Figure 2:
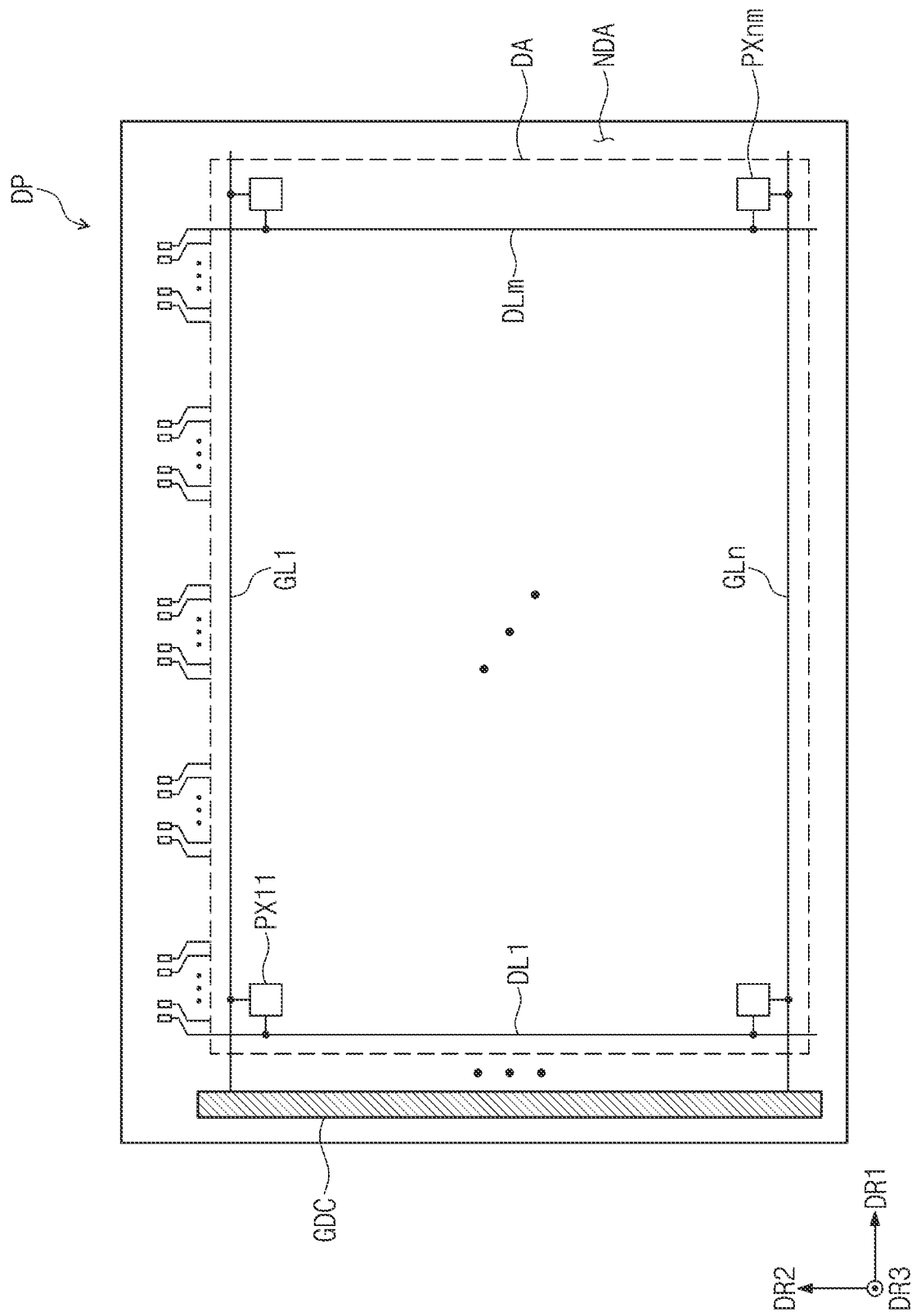
FIG. 2 is a plan view showing a display panel according to an exemplary embodiment of the present disclosure.

FIG. 1A is a perspective view showing a display panel DP according to an exemplary embodiment of the present disclosure. FIG. 1B is a cross-sectional view showing the display panel DP according to an exemplary embodiment of the present disclosure. FIG. 2 is a plan view showing the display panel DP according to an exemplary embodiment of the present disclosure.

Referring to FIGS. 1A, 1B, and 2, the display panel DP may be one of a liquid crystal display panel, an electrophoretic display panel, a microelectromechanical system (MEMS) display panel, an electrowetting display panel, and an organic light emitting display panel, however, it should not be particularly limited to the display panels listed above.

Although not shown in figures, the display panel DP may further include a chassis member or a molding member, and may further include a backlight unit depending on a type of the display panel DP.

The display panel DP may include a lower display substrate 100 and an upper display substrate 200 facing the lower display substrate 100 and spaced apart from the lower display substrate 100. For example, the upper display substrate 200 may space apart from the lower display substrate 100 by a sealant SLM.

As shown in FIG. 1A, the display panel DP may display an image through a display area DA in a display surface DP-IS. An outer surface 200-OS of the upper display substrate 200 shown in FIG. 1B may be the display surface DP-IS.

The display surface DP-IS may be substantially parallel to a plane defined by a first direction DR1 and a second direction DR2. The display surface DP-IS may include a display area DA and a non-display area NDA. Pixels PX may be disposed in the display area DA and may not be disposed in the non-display area NDA. The non-display area NDA may be defined along an edge of the display surface DP-IS. The non-display area NDA may surround the display area DA.

A third direction DR3 may indicate a normal line direction of the display surface DP-IS, i.e., a thickness direction of the display panel DP. Front (or upper) and rear (or lower) surfaces of each member are distinguished from each other by the third direction DR3. However, the first, second, and third directions DR1, DR2, and DR3 described in the present exemplary embodiment are exemplary.

In the exemplary embodiment of the present disclosure, the display panel DP may include the display surface DP-IS that is flat, however, the display surface DP-IS should not be limited to the flat surface. The display panel DP may include a curved display surface or a three-dimensional display surface. The three-dimensional display surface may include plural display areas that face different directions from each other.

FIG. 2 shows a plan view of the display panel DP in which signal lines GL1 to GLn connected to a gate metal circuit GDC and DL1 to DLm, and pixels PX11 to PXnm are disposed. The signal lines GL1 to GLn and DL1 to DLm may include a plurality of gate lines GL1 to GLn and a plurality of data lines DL1 to DLm.

Each of pixels PX11 to PXnm may be connected to a corresponding gate line among the gate lines GL1 to GLn and a corresponding data line among the data lines DL1 to DLm. Each of the pixels PX11 to PXnm may include a pixel driving circuit and a display element. Types of signal lines disposed in the display panel DP may be determined according to a configuration of the pixel driving circuit.

The pixels PX11 to PXnm may be arranged in a matrix form, however, the arrangement of the pixels PX11 to PXnm should not be limited to the matrix form. The pixels PX11 to PXnm may be arranged in a pentile pattern. The pixels PX11 to PXnm may be arranged in a lozenge shape.

A gate driving circuit (GDC) may be disposed in the non-display area NDA. For example, the gate driving circuit may be directly integrated in the display panel DP through an oxide silicon gate driver circuit (OSG) process or an amorphous silicon gate driver circuit (ASG) process.

Figure 3B:
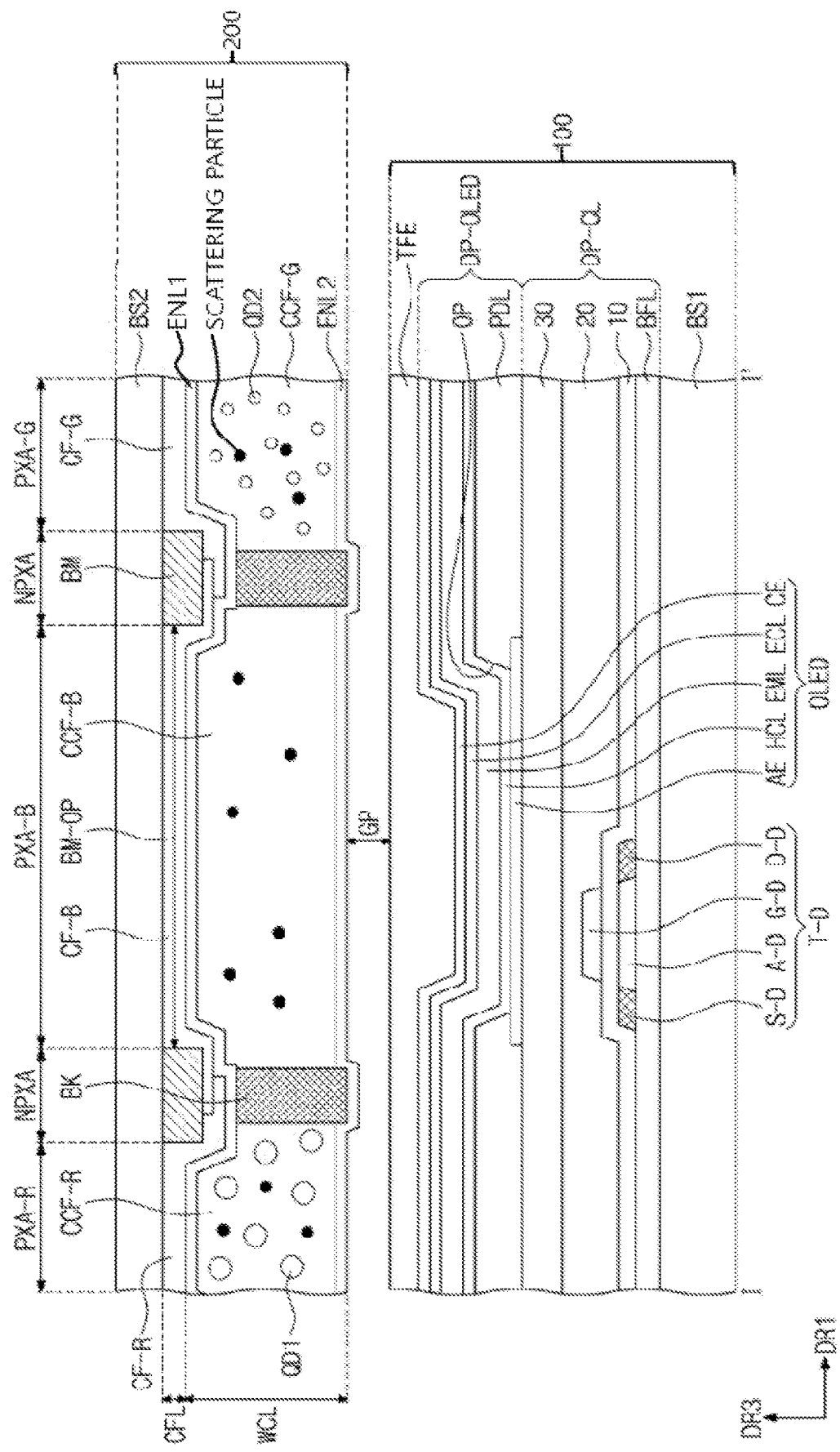
FIG. 3B is a cross-sectional view taken along a line I-I' of FIG. 3A according to an exemplary embodiment of the present disclosure.
Figure 3C:
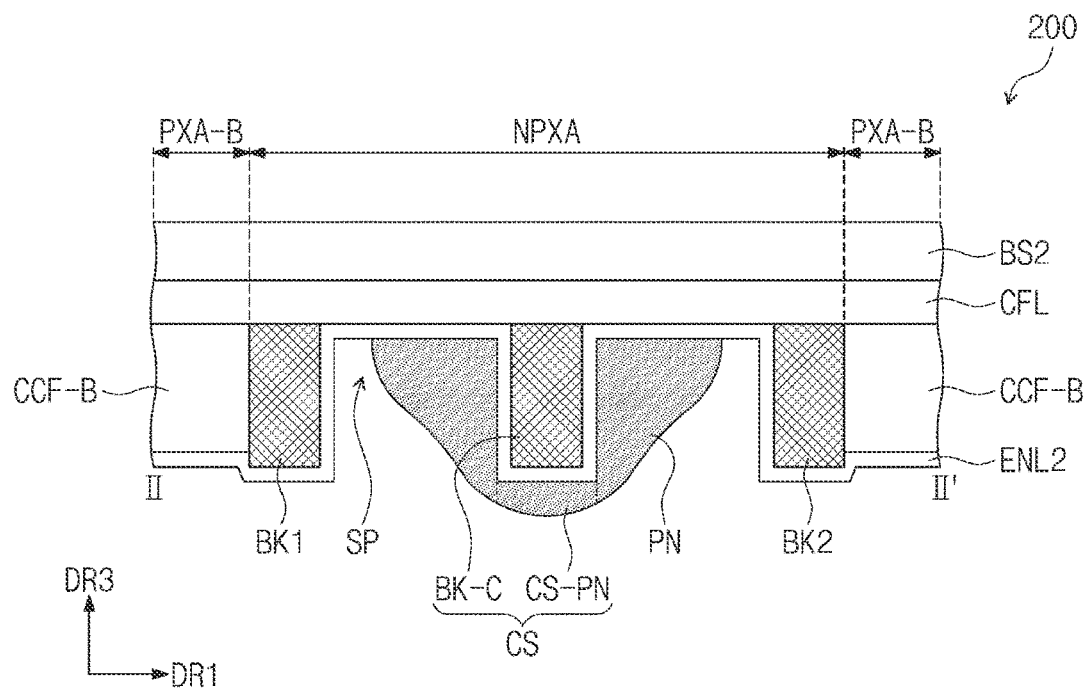
FIG. 3C is a cross-sectional view taken along a line II-II' of FIG. 3A according to an exemplary embodiment of the present disclosure.
Figure 3D:
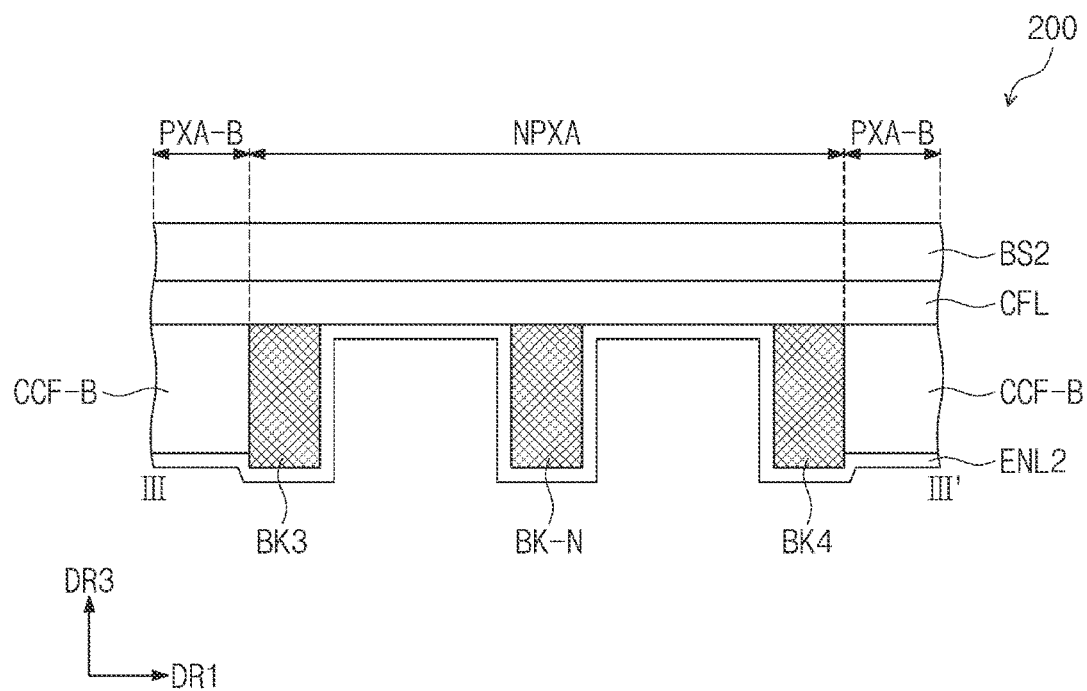
FIG. 3D is a cross-sectional view taken along a line III-III' of FIG. 3A according to an exemplary embodiment of the present disclosure.
Figure 3E:
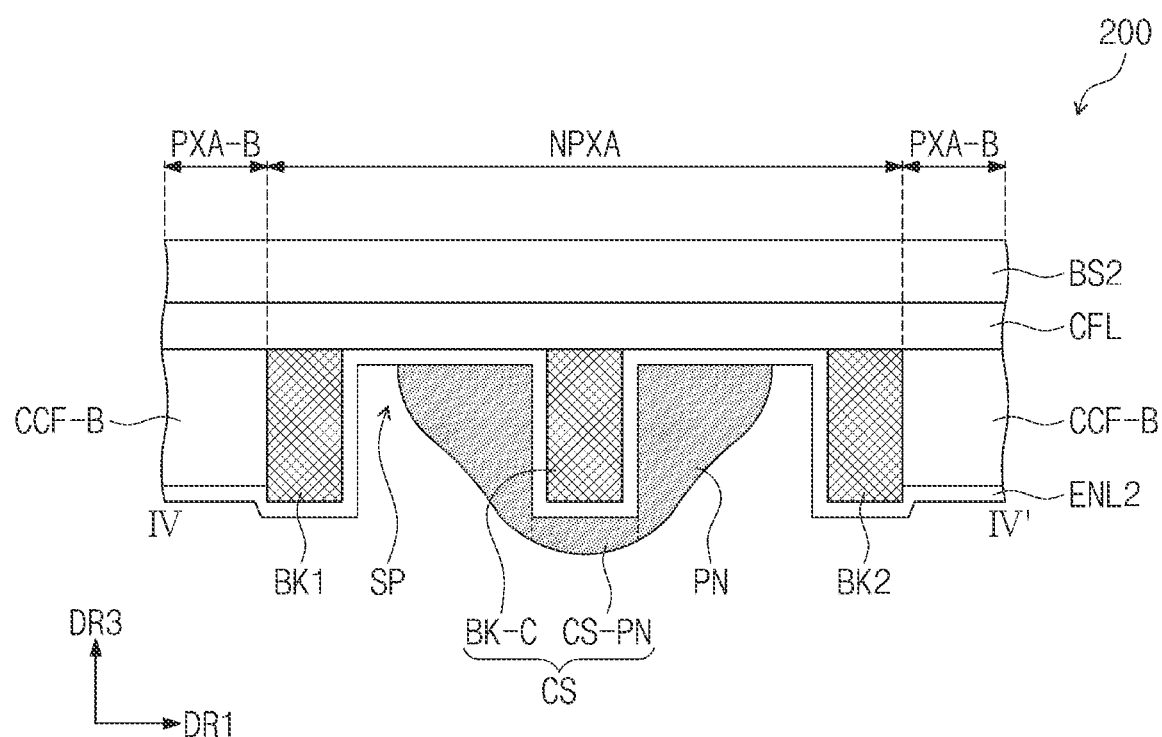
FIG. 3E is a cross-sectional view taken along a line IV-IV' of FIG. 3A according to an exemplary embodiment of the present disclosure.

FIG. 3A is a plan view showing the display area DA of the display panel DP according to an exemplary embodiment of the present disclosure. FIG. 3B is a cross-sectional view taken along a line I-I' of FIG. 3A according to an exemplary embodiment of the present disclosure. FIG. 3C is a cross-sectional view taken along a line II-II' of FIG. 3A according to an exemplary embodiment of the present disclosure. FIG. 3D is a cross-sectional view taken along a line III-III' of FIG. 3A according to an exemplary embodiment of the present disclosure. FIG. 3E is a cross-sectional view taken along a line IV-IV' of FIG. 3A according to an exemplary embodiment of the present disclosure.

FIG. 3A is an enlarged view showing a portion of the display area DA shown in FIG. 1A. Three pixel areas PXA-R, PXA-G, and PXA-B are mainly shown. The three pixel areas PXA-R, PXA-G, and PXA-B shown in FIG. 3A may be repeatedly arranged in the display area DA along the first direction DR1 and the second direction DR2.

A light blocking area NPXA may be disposed to surround first, second, and third pixel areas PXA-R, PXA-G, and PXA-B. The first, second, and third pixel areas PXA-R, PXA-G, and PXA-B and the light blocking area NPXA may be substantially defined in the upper display substrate 200.

In the present exemplary embodiment, at least two of the first, second, and third pixel areas PXA-R, PXA-G, and PXA-B may have different sizes in a plan view, however, they should not be limited thereto or thereby. All of the first, second, and third pixel areas PXA-R, PXA-G, and PXA-B may have the same size or each of the first, second, and third pixel areas PXA-R, PXA-G, and PXA-B may have different sizes. The first, second, and third pixel areas PXA-R, PXA-G, and PXA-B may have a polygonal shape in a plan view, however, they should not be limited thereto or thereby. The first, second, and third pixel areas PXA-R, PXA-G, and PXA-B may have a rectangular shape with a rounded corner or a square shape with a rounded corner in a plan view.

Among the first, second, and third pixel areas PXA-R, PXA-G, and PXA-B, one pixel area may provide a first color light to a user, another pixel area may provide a second color light different from the first color light to the user, and the other pixel area may provide a third color light different from the first color light and the second color light to the user.

In the present exemplary embodiment, the first pixel area PXA-R may provide a red light, the second pixel area PXA-G may provide a green light, and the third pixel area PXA-B may provide a blue light. In the present exemplary embodiment, a source light may be the blue light that is the third color light. The source light may be generated by a light source such as a backlight unit or a display element such as a light emitting diode.

The light blocking area NPXA may serve as a boundary between the first, second, and third pixel areas PXA-R, PXA-G, and PXA-B, and thus, a color mixture between the first, second, and third pixel areas PXA-R, PXA-G, and PXA-B may be prevented. In addition, the light blocking area NPXA may block the source light so that the source light is not provided to the user through the light blocking area NPXA.

FIG. 3B shows a cross-section of the display panel DP corresponding to the third pixel area PXA-B. FIG. 3B shows a cross-section corresponding to a driving transistor T-D and a light emitting element OLED.

Referring to FIG. 3B, the cross-section corresponding to the driving transistor T-D and the light emitting element OLED are shown as a representative example. The upper display substrate 200 and the lower display substrate 100 may be spaced apart from each other by a predetermined gap GP.

The gap GP may be maintained by a column spacer CS (refer to FIG. 3C) disposed in the upper display substrate 200. The column spacer CS will be described in detail later. In FIG. 3B, an air layer is shown as a representative example of the gap GP, however, the gap GP should not be limited to the air layer. The gap GP may be filled with an organic adhesive layer or an inorganic adhesive layer.

As shown in FIG. 3B, the lower display substrate 100 may include a first base substrate BS1, a circuit element layer DP-CL disposed on the first base substrate BS1, and a display element layer DP-OLED disposed on the circuit element layer DP-CL.

The first base substrate BS1 may include a synthetic resin substrate or a glass substrate. The circuit element layer DP-CL may include at least one insulating layer and a circuit element. The circuit element may include signal lines and a pixel driving circuit. The circuit element layer DP-CL may be formed by a process of forming an insulating layer, a semiconductor layer, and a conductive layer, such as coating and depositing processes, and a process of patterning the insulating layer, the semiconductor layer, and the conductive layer, such as a photolithography process.

In the present exemplary embodiment, the circuit element layer DP-CL may include a buffer layer BFL, a first insulating layer 10, a second insulating layer 20, and a third insulating layer 30. The first insulating layer 10 and the second insulating layer 20 may be an inorganic layer, and the third insulating layer 30 may be an organic layer.

FIG. 3B shows a structure of an active region A-D, a source region S-D, a drain region D-D, and a gate electrode G-D that form the driving transistor T-D. The active region A-D, the source region S-D and the drain region D-D may be distinguished from each other according to a doping concentration or a conductivity of an active layer.

The display element layer DP-OLED may include the light emitting element OLED. The light emitting element OLED may generate the above-described source light. The light emitting element OLED may include a first electrode AE, a second electrode CE, and a light emitting layer EML disposed between the first electrode AE and the second electrode CE. In the present exemplary embodiment, the light emitting element OLED may include an organic light emitting diode. The display element layer DP-OLED may include a pixel definition layer PDL. As an example, the pixel definition layer PDL may be, but not limited to, an organic layer.

The first electrode AE may be disposed on the third insulating layer 30. In FIG. 3B, a connection structure between the first electrode AE and the driving transistor T-D is not shown, however, the first electrode AE may be connected directly or indirectly to the driving transistor T-D. An opening OP may be formed through the pixel definition layer PDL. At least a portion of the first electrode AE may be exposed through an opening OP of the pixel definition layer PDL. The first electrode AE exposed by the pixel definition layer PDL may be the light emitting area.

A hole control layer HCL, the light emitting layer EML, and an electron control layer ECL may be disposed over the first electrode AE and the pixel definition layer PDL in common. The hole control layer HCL, the light emitting layer EML, and the electron control layer ECL may be disposed in the first, second, and third pixel areas PXA-R, PXA-G, and PXA-B (refer to FIG. 3A) in common.

The hole control layer HCL may include a hole transport layer and may further include a hole injection layer. The light emitting layer EML may generate the blue light. The blue light may have a wavelength from about 410 nm to about 480 nm. A light emission spectrum of the blue light may have a maximum peak within a range from about 440 nm to about 460 nm. The electron control layer ECL may include an electron transport layer and may further include an electron injection layer. The light emitting layer EML may have a tandem structure or a single-layer structure.

The second electrode CE may be disposed on the electron control layer ECL. The second electrode CE may be disposed in the first, second, and third pixel areas PXA-R, PXA-G, and PXA-B (refer to FIG. 3A) in common. The second electrode CE may have an area greater than that of the first electrode AE.

A thin film encapsulation layer TFE may be disposed on the second electrode CE to encapsulate the second electrode CE. The thin film encapsulation layer TFE may include an organic material or an inorganic material. In detail, the thin film encapsulation layer TFE may have a multi-layer structure in which an inorganic layer and an organic layer are alternatingly stacked. For example, the thin film encapsulation layer TFE may have an encapsulation structure of the inorganic layer/organic layer/inorganic layer. The thin film encapsulation layer TFE may further include a refractive-index control layer to improve a light emission efficiency.

Although not shown in figures, the lower display substrate 100 may include first, second, and third display elements respectively corresponding to the first, second, and third pixel areas PXA-R, PXA-G, and PXA-B shown in FIG. 3A. The first, second, and third display elements may have the same stack structure and may have substantially the same stack structure as that of the light emitting element OLED shown in FIG. 3B.

As shown in FIG. 3B, the upper display substrate 200 may include a second base substrate BS2, a color filter layer CFL disposed on a lower surface of the second base substrate BS2, and a light control layer WCL disposed under the color filter layer CFL.

The second base substrate BS2 may include a synthetic resin substrate or a glass substrate. The color filter layer CFL may include a division pattern BM disposed on the lower surface of the second base substrate BS2, a first color filter CF-R overlapping the first pixel area PXA-R, a second color filter CF-G overlapping the second pixel area PXA-G, and a third color filter CF-B overlapping the third pixel area PXA-B.

The division pattern BM may be a light blocking pattern and disposed on the second base substrate BS2 to overlap the light blocking area NPXA. An opening BM-OP may be defined through the division pattern BM to correspond to each of the first, second, and third pixel areas PXA-R, PXA-G, and PXA-B. In the present exemplary embodiment, the third pixel area PXA-B may be defined to correspond to the opening BM-OP of the division pattern BM.

The first color filter CF-R, the second color filter CF-G, and the third color filter CF-B may transmit lights having different wavelengths from each other. In the present exemplary embodiment, the first color filter CF-R may be a red color filter, the second color filter CF-G may be a green color filter, and the third color filter CF-B may be a blue color filter.

The first color filter CF-R, the second color filter CF-G, and the third color filter CF-B may include a base resin and a dye and/or pigment dispersed in the base resin. The first color filter CF-R, the second color filter CF-G, and the third color filter CF-B may include different types of dyes and/or pigments.

The light control layer WCL may include a plurality of banks BK, a first light control portion CCF-R, a second light control portion CCF-G, and a third light control portion CCF-B. The first, second, and third light control portions CCF-R, CCF-G, and CCF-B may be disposed between the banks BK.

Each of the first light control portion CCF-R and the second light control portion CCF-G may absorb the source light and may generate a light having a color different from a color of the source light. The first light control portion CCF-R and the second light control portion CCF-G may be a light conversion layer. The first light control portion CCF-R may generate a light that is transmitted the first color filter CF-R, and the second light control portion CCF-G may generate a light that is transmitted the second color filter CF-G.

Each of the first, second, and third light control portions CCF-R, CCF-G, and CCF-B may include a base resin, scattering particles, and quantum dots. The scattering particles may scatter the source light incident into the light control portion. The third light control portions CCF-B may not have quantum dots.

Each of the first and second light control portions CCF-R and CCF-G may include a base resin and corresponding quantum dots QD1 (or QD2) mixed with (or dispersed in) the base resin. The base resin may be a medium in which the quantum dots QD1 and QD2 are dispersed, and may include various resin compositions that are generally referred to as a binder, however, it should not be limited thereto or thereby. In the present disclosure, any medium in which the quantum dots are dispersed may be referred to as the base resin regardless of its name, additional functions, constituent materials, etc. The base resin may be a polymer resin. For example, the base resin may be an acrylic-based resin, a urethane-based resin, a silicone-based resin, or an epoxy-based resin. The base resin may be a transparent resin.

The quantum dots QD1 and QD2 are particles that change a wavelength of light incident thereto. The quantum dots QD1 and QD2 are a material having a crystal structure of several nanometers in size, contain hundreds to thousands of atoms, and exhibit a quantum confinement effect in which an energy band gap increases due to a small size. When a light having a wavelength with an energy higher than the band gap is incident into the quantum dots QD1 and QD2, the quantum dots QD1 and QD2 absorb the light and become excited, and then, the quantum dots QD1 and QD2 emit light of a specific wavelength and fall to the ground state. The emitted light of the specific wavelength has a value corresponding to the band gap. The quantum dots QD1 and QD2 may control their light-emitting property due to the quantum confinement effect by adjusting their size and composition.

The first light control portion CCF-R may include a first quantum dot, and the second light control portion CCF-G may include a second quantum dot different from the first quantum dot. The first quantum dot may absorb the blue light and may generate the red light. The second quantum dot may absorb the blue light and may generate the green light.

The quantum dots may be selected from a group II-VI compound, a group III-V compound, a group IV-VI compound, a group IV element, a group IV compound, and a combination thereof.

The group II-VI compound may be selected from a binary compound selected from the group consisting of CdS, CdSe, CdTe, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V compound may be selected from a binary compound selected from the group consisting of GaN, GaP, GaAs, GaSb, AN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof, and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, GaAlNP, and a mixture thereof.

The group IV-VI compound may be selected from a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The group IV element may be selected from the group consisting of Si, Ge, and a mixture thereof. The group IV compound may be a binary compound selected from the group consisting of SiC, SiGe, and a mixture thereof.

In this case, the binary compound, the ternary compound, or the quaternary compound may exist in the particles at a uniform concentration or may exist in the same particle after being divided into plural portions having different concentrations.

Each quantum dot may have a core-shell structure that includes a core and a shell surrounding the core. In addition, each quantum dot may have a core-shell structure where one quantum dot surrounds another quantum dot. An interface between the core and the shell may have a concentration gradient in which a concentration of elements existing in the shell is lowered as a distance from the core decreases.

The quantum dots may be nanometer-scale particles. The quantum dots may have a full width of half maximum (FWHM) of the light emission wavelength spectrum of about 45 nm or less, preferably about 40 nm or less, and more preferably about 30 nm or less. A color purity and a color reproducibility may be improved within this range. In addition, since the light emitted through the quantum dots may be emitted in all directions, an optical viewing angle may be improved.

In addition, the shape of the quantum dots is a shape commonly used in the art, and it should not be particularly limited. In more detail, spherical, pyramidal, multi-arm, or cubic nanoparticles, nanotubes, nanowires, nanofibers, nanoplatelets, or the like may be applied to the quantum dots.

The third light control portion CCF-B may transmit the source light. In the exemplary embodiment, the third light control portion CCF-B may transmit the blue light. The third light control portion CCF-B may include the base resin and may further include the scattering particles. The scattering particles may be titanium oxide ($TiO_2$) particles or silica-based nanoparticles.

The banks BK may include an organic material. For example, the banks BK may include a liquid repellent organic material, however, it should not be limited thereto or thereby. The banks BK may further include an inorganic material.

The upper display substrate 200 may further include at least one capping layer. For example, a first capping layer ENL1 may cover the first color filter CF-R, the second color filter CF-G, and the third color filter CF-B. The first capping layer ENL1 may include an inorganic layer. The first capping layer ENL1 may include one of silicon oxide, silicon nitride, and silicon oxynitride. The first capping layer ENL1 may further include an organic layer that provides a flat lower surface.

A second capping layer ENL2 may cover the first, second, and third light control portion CCF-R, CCF-G, and CCF-B. The second capping layer ENL2 may include an inorganic layer. The second capping layer ENL2 may further include an organic layer disposed under the inorganic layer to provide the flat lower surface.

FIGS. 3C to 3E are cross-sectional views showing the upper display substrate 200 according to an exemplary embodiment of the present disclosure. Hereinafter, detailed descriptions of the same elements as those of FIGS. 1A to 3B will be omitted.

FIG. 3C shows a light blocking area NPXA disposed between adjacent third pixel areas PXA-B along the first direction DR1.

In the exemplary embodiment, a plurality of banks BK may overlap the light blocking area NPXA and may include a first bank BK1, a second bank BK2, and a bridge bank BK-C which are disposed on the color filter layer CFL on a second base substrate BS2. The first bank BK1, the second bank BK2, and the bridge bank BK-C may be disposed to be adjacent to each other along the first direction DR1. The first bank BK1, the second bank BK2, and the bridge bank BK-C may be formed at the same time using the same material. A predetermined space SP may be defined between the first bank BK1, the second bank BK2, and the bridge bank BK-C.

In the exemplary embodiment, a color filter layer CFL may be disposed on the second base substrate BS2. The first bank BK1, the second bank BK2, and the bridge bank BK-C may be disposed on the color filter layer CFL.

The bridge bank BK-C may be disposed between the adjacent first bank BK1 and the second bank BK2 along the first direction DR1. The bridge bank BK-C may be disposed at a center between the first bank BK1 and the second bank BK2 to have substantially circular configuration but the shape of the bridge bank BK-C should not be limited thereto or thereby. The shape of the bridge bank BK-C may have a polygon. An organic material pattern PN containing an organic material may be disposed on the bridge bank BK-C to overlap the bridge bank BK-C in a plan view. The organic material pattern PN may include at least one of a light blocking material and a resin. The organic material pattern PN may have a light blocking property, an insulating property, and elasticity.

In the exemplary embodiment, a second capping layer ENL2 may be disposed on the first bank BK1, the second bank BK2, and the bridge bank BK-C between the organic material pattern PN and the first bank BK1, the second bank BK2, and the bridge bank BK-C. The organic material pattern PN may be in direct contact with the second capping layer ENL2.

The organic material pattern PN may be disposed between the first bank BK1 and the second bank BK2 in a plan view, and at least a portion thereof may be disposed on the bridge bank BK-C to overlap the bridge bank BK-C in a plan view. The organic material pattern PN may completely cover the bridge bank BK-C in a plan view. Hereinafter, the organic material pattern PN that overlaps the bridge bank BK-C in a plan view may be referred to as a "bridge pattern CS-PN".

The bridge bank BK-C and the bridge pattern CS-PN may be the column spacer CS that maintains the gap GP (refer to FIG. 3B) between the upper display substrate 200 and the lower display substrate 100.

In the exemplary embodiment, the column spacer CS may be disposed between the pixels PX11 to PXnm (refer to FIG. 2) or may be disposed at regular intervals between the pixels PX11 to PXnm (refer to FIG. 2). For example, the column spacer CS may be disposed every four pixels among the pixels PX11 to PXnm (refer to FIG. 2) along the first direction DR1 and may be disposed every three pixels among the pixels PX11 to PXnm (refer to FIG. 2) along the second direction DR2. However, the exemplary embodiment should not be limited thereto or thereby, the intervals in which the organic material pattern PN is disposed may be set as needed without particular limitation.

When the column spacer CS is disposed at regular intervals, the column spacer CS may not be disposed in some light blocking areas NPXA.

FIG. 3D shows the light blocking area NPXA in which the column spacer CS is not disposed. In the exemplary embodiment, the banks BK may include a third bank BK3, a fourth bank BK4, and a non-bridge bank BK-N, which are disposed to overlap the light blocking area NPXA. The third bank BK3, the fourth bank BK4, and the non-bridge bank BK-N may be disposed to be adjacent to each other. The third bank BK3, the fourth bank BK4, and the bridge bank BK-N may be formed at the same time using the same material.

In the exemplary embodiment, the color filter layer CFL may be disposed on the second base substrate BS2. The third bank BK3, the fourth bank BK4, and the non-bridge bank BK-N may be disposed on the color filter layer CFL.

The non-bridge bank BK-N may be disposed between the third bank BK3 and the fourth bank BK4. In the exemplary embodiment, the non-bridge bank BK-N may be disposed at a center between the third bank BK3 and the fourth bank BK4. An organic material pattern may not be disposed on the non-bridge bank BK-N.

The organic material pattern may not be disposed on an upper surface of the non-bridge bank BK-N. The non-bridge bank BK-N may not form the column spacer.

The second capping layer ENL2 may be disposed on the third bank BK3, the fourth bank BK4, and the non-bridge bank BK-N.

FIG. 3E shows the column spacer CS disposed to overlap the light blocking area NPXA.

Referring to the display area DA of FIGS. 3C to 3E, the bridge bank BK-C may be disposed between the pixels PX11 to PXnm (refer to FIG. 2). The organic material pattern PN may be disposed every four pixels along the first direction DR1 and may be disposed every three pixels along the second direction DR2. Depending on the intervals in which the organic material pattern PN is disposed, a portion in which both the bridge bank BK-C and the organic material pattern PN are disposed may serve as the column spacer CS.

Figure 4:
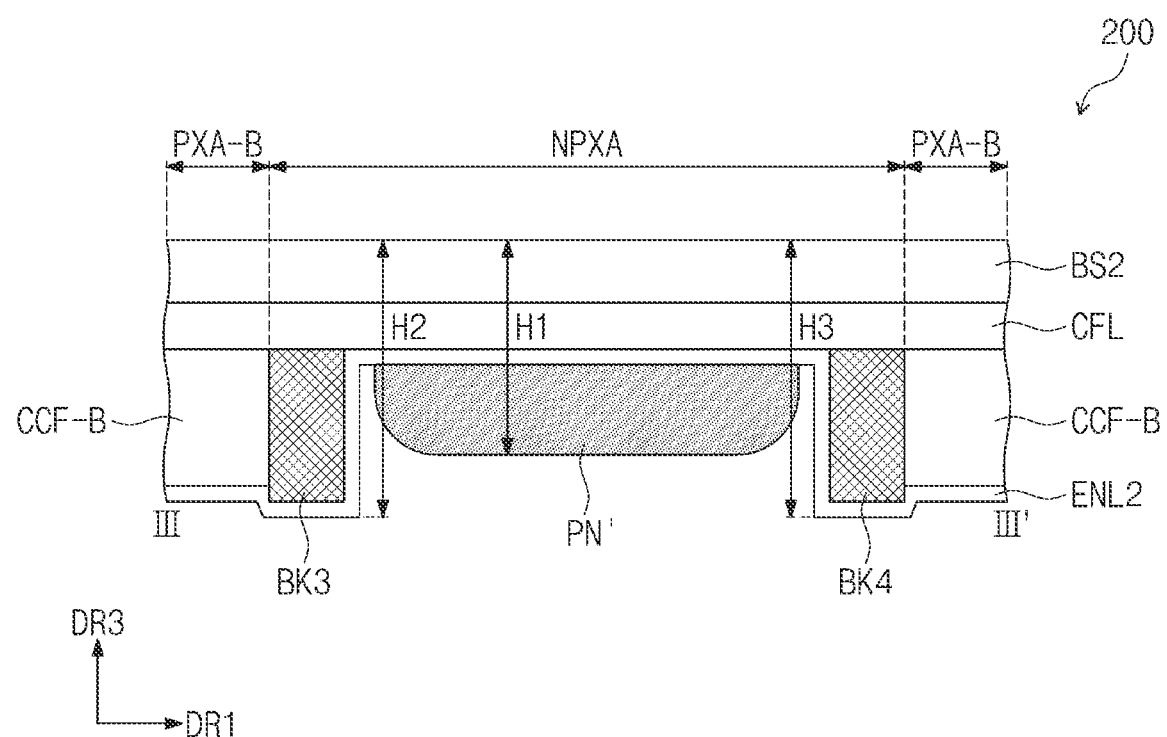
FIG. 4 is a cross-sectional view taken along a line III-III' of FIG. 3A according to another exemplary embodiment of the present disclosure.

FIG. 4 is a cross-sectional view taken along a line III-III' of FIG. 3A according to another exemplary embodiment of the present disclosure. Hereinafter, detailed descriptions of the same elements as those described with reference to FIGS. 1A to 3E will be omitted.

FIG. 4 shows a light blocking area NPXA in which a column spacer is not disposed according to another exemplary embodiment. A plurality of banks BK may include a third bank BK3, a fourth bank BK4, and an organic material pattern PN', which are disposed to overlap the light blocking area NPXA. The third bank BK3 and the fourth bank BK4 may be disposed to be adjacent to each other.

The organic material pattern PN' may be disposed between the third bank BK3 and the fourth bank BK4 and may be disposed on a second base substrate BS2. In detail, the organic material pattern PN' may be disposed between the third bank BK3 and the fourth bank BK4 and may be disposed on a second capping layer ENL2 disposed on the second base substrate BS2.

In the exemplary embodiment, the organic material pattern PN' may have a height H1 smaller than each of a height H2 of the third bank BK3 and a height H3 of the fourth bank BK4. In the present disclosure, the height is a length measured based on a lower surface of the second base substrate BS2.

Since the height H1 of the organic material pattern PN' shown in FIG. 4 is smaller than each of the height H2 of the third bank BK3 and the height H3 of the fourth bank BK4, different from the organic material pattern PN shown in FIG. 3C, the organic material pattern PN' may not form the column spacer.

Referring to FIG. 4, the organic material pattern PN' may be disposed between the pixels PX11 to PXnm (refer to FIG. 2). A bridge bank BK-C (refer to FIG. 3C) may be disposed at regular intervals. For example, the bridge banks BK-C (refer to FIG. 3C) may be disposed every four pixels along the first direction DR1 and may be disposed every three pixels along the second direction DR2. Depending on the intervals in which the bridge bank BK-C (refer to FIG. 3C) is disposed, a portion in which both the bridge bank BK-C (refer to FIG. 3C) and the organic material pattern PN are disposed may serve as the column spacer CS (refer to FIG. 3C). In addition, as shown in FIG. 4, the column spacer may not be formed in the light blocking area NPXA in which one of the bridge bank BK-C (refer to FIG. 3C) and the organic material pattern PN is not disposed. For example, referring to FIG. 4, a column spacer is not formed in the light blocking area NPXA, because the bridge bank BK-C (refer to FIG.

3C) is not disposed in the light blocking area NPXA and only the organic material pattern PN' is disposed in the light blocking area NPXA.

Figure 5A:
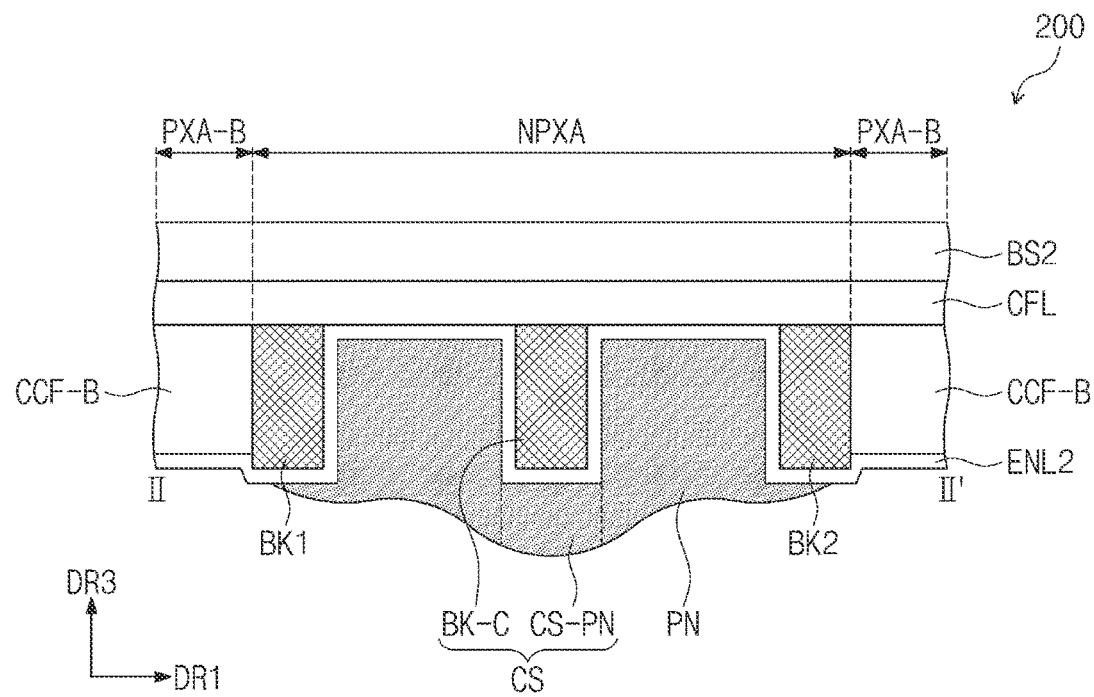
FIG. 5A is a cross-sectional view taken along a line II-II' of FIG. 3A according to another exemplary embodiment of the present disclosure.
Figure 5B:
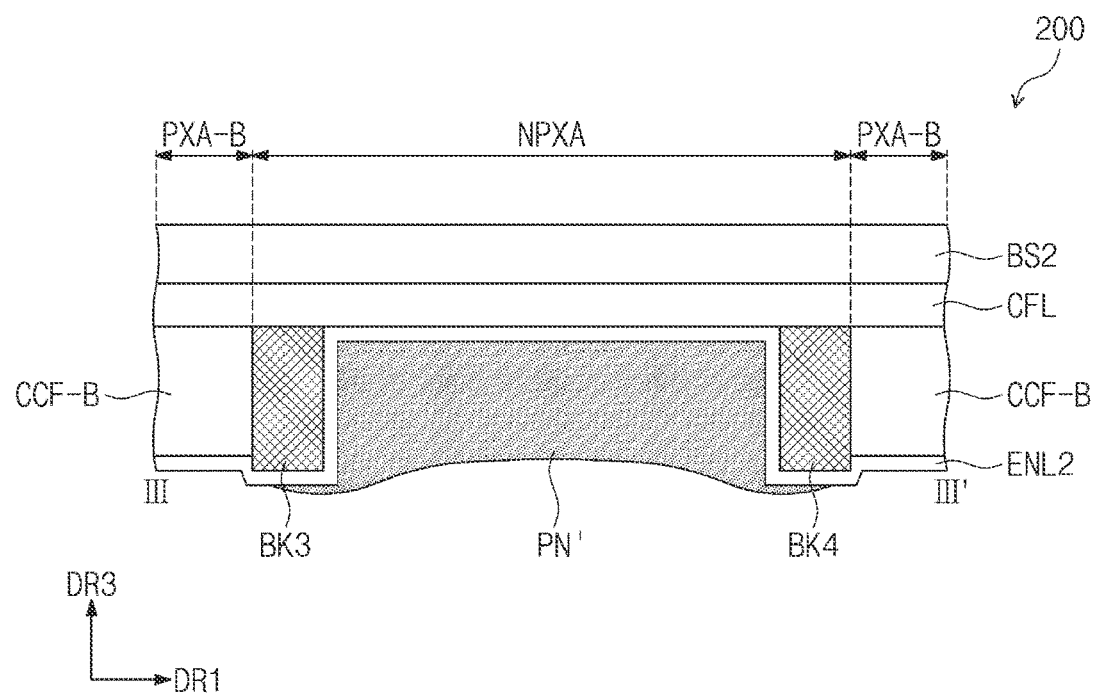
FIG. 5B is a cross-sectional view taken along a line III-III' of FIG. 3A according to another exemplary embodiment of the present disclosure.

FIG. 5A is a cross-sectional view taken along a line II-II' of FIG. 3A according to another exemplary embodiment of the present disclosure. FIG. 5B is a cross-sectional view taken along a line III-III' of FIG. 3A according to another exemplary embodiment of the present disclosure. Referring to FIG. 5A, an organic material pattern PN may be disposed to overlap a first bank BK1, a bridge bank BK-C, and a second bank BK2 in a plan view and may be disposed not to overlap a third light control portion CCF-B. The bridge bank BK-C and a bridge pattern CS-PN may form a column spacer CS.

In the exemplary embodiment, the organic material pattern PN may completely fill the predetermined space (refer to "SP" of FIG. 3C) between the first bank BK1, the bridge bank BK-C, and the second bank BK2. As the predetermined space (refer to "SP" of FIG. 3C) is completely filled with the organic material pattern PN, air bubbles may be prevented from being generated during a bonding process of an upper display substrate 200 and a lower display substrate 100, and a reliability of the display panel DP may be improved.

Referring to FIG. 5B, an organic material pattern PN' may completely fill the predetermined space (refer to "SP" of FIG. 3C) between a third bank BK3 and a fourth bank BK4. As the predetermined space (refer to "SP" of FIG. 3C) is filled with the organic material pattern PN', air bubbles may be prevented from being generated during a bonding process of an upper display substrate 200 and a lower display substrate 100, and a reliability of the display panel DP may be improved.

FIG. 6 is a cross-sectional view showing a display panel DP according to an exemplary embodiment of the present disclosure. The display panel DP may include a lower display substrate 100 and an upper display substrate 200. Since the upper display substrate 200 may include a column spacer CS that includes a bridge bank BK-C and a bridge pattern CS-PN, a gap between the lower display substrate 100 and the upper display substrate 200 may be maintained.

In the display panel DP according to the exemplary embodiment, the bridge bank BK-C disposed in a light blocking area NPXA and the bridge pattern CS-PN disposed on the bridge bank BK-C may serve as the column spacer CS without forming a separate column spacer that maintains the gap between the lower display substrate 100 and the upper display substrate 200. Accordingly, due to a predetermined space defined between the bridge bank BK-C and the other banks disposed in the light blocking area NPXA, defects caused by mis-ejection during an inkjet process may be prevented and the gap between the lower display substrate 100 and the upper display substrate 200 may be maintained, and thus, the reliability of the display panel DP may be improved.

Figure 7:
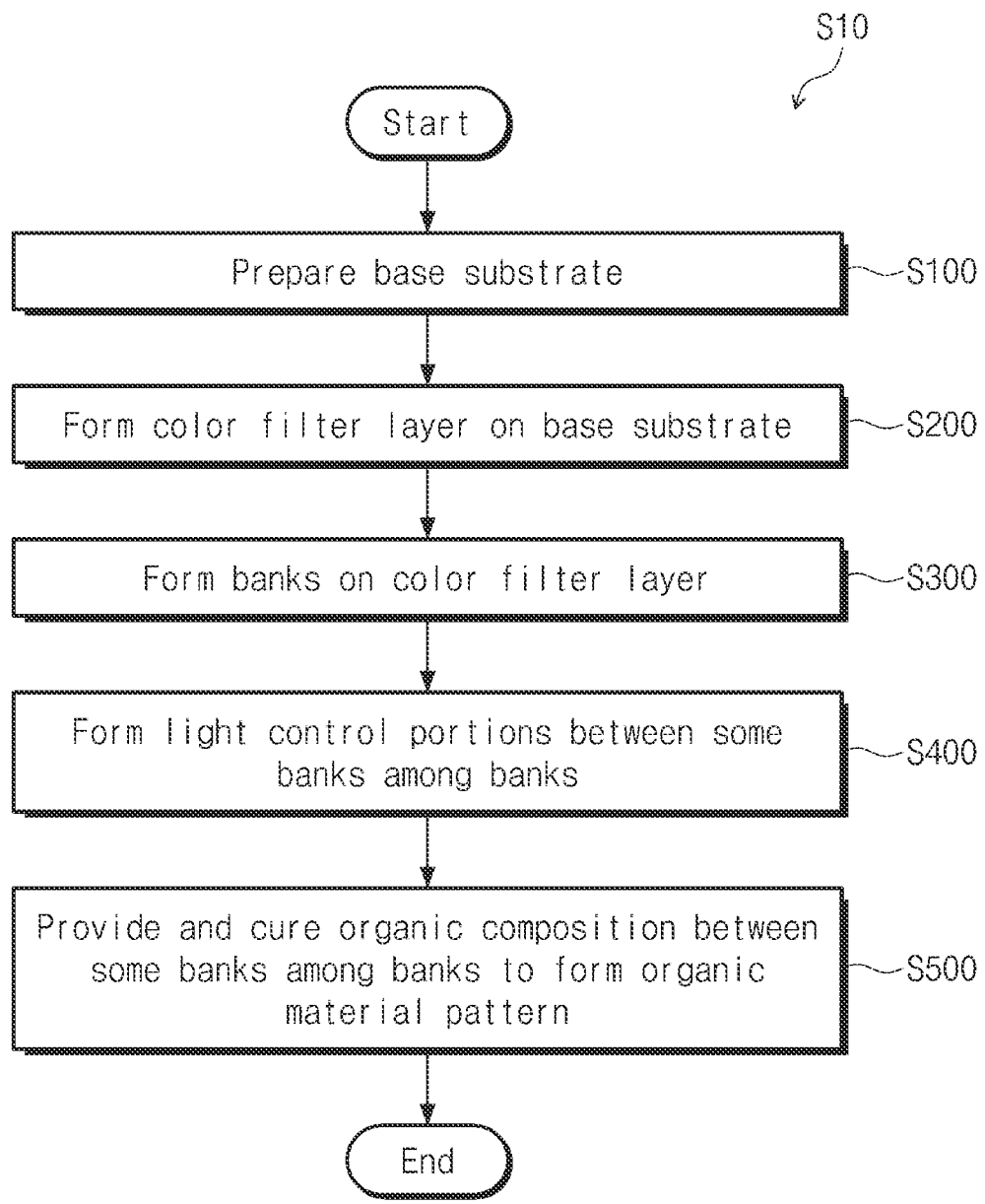
FIG. 7 is a flowchart showing a method of manufacturing a display panel according to an exemplary embodiment of the present disclosure.

FIG. 7 is a flowchart showing a method of manufacturing the display panel DP according to an exemplary embodiment of the present disclosure. FIGS. 8A to 8H are views showing the method of manufacturing the display panel DP according to an exemplary embodiment of the present disclosure.

Referring to FIG. 7, the manufacturing method of the display panel DP (S10) may include preparing the base substrate (S100), forming the color filter layer on the base substrate (S200), forming the banks on the color filter layer (S300), forming the light control portions between some banks among the banks (S400), and providing and curing an organic composition between some banks among the banks to form the organic material pattern (S500).

Figure 8A:
FIGS. 8A, 8B, 8C, 8D, 8E, 8F, 8G and 8H are views showing processes of the method of manufacturing a display panel according to an exemplary embodiment of the present disclosure.
Figure 8B:
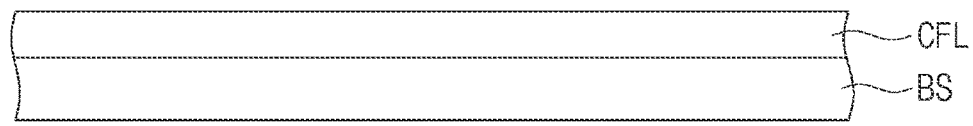

Referring to FIGS. 7, 8A, and 8B, the preparing of the base substrate BS (S100) may include preparing the synthetic resin substrate or the glass substrate. Although not shown in figures, the forming of the color filter layer CFL on the base substrate BS (S200) may include forming the division pattern BM (refer to FIG. 3B), the first color filter CF-R (refer to FIG. 3B), the second color filter CF-G (refer to FIG. 3B), and the third color filter CF-B (refer to FIG. 3B) on the base substrate BS.

Figure 8C:
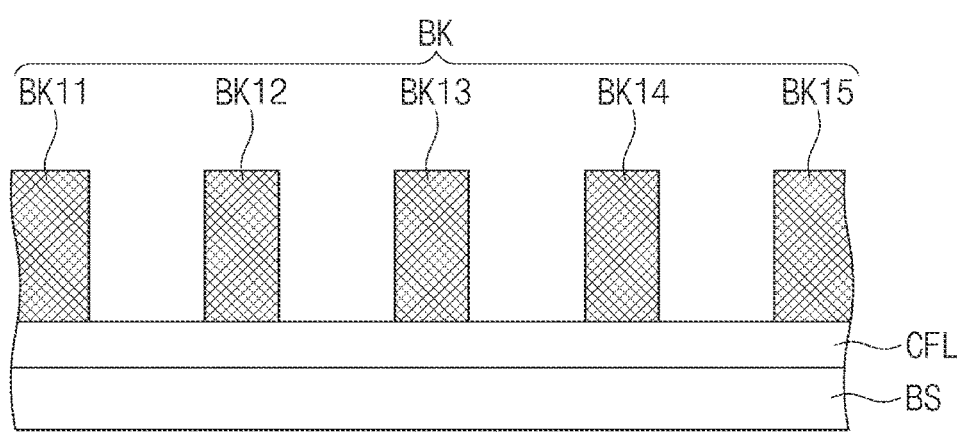

Referring to FIGS. 7 and 8C, the forming of the banks BK on the color filter layer CFL (S300) may include forming eleventh, twelfth, thirteenth, fourteenth, and fifteenth banks BK11, BK12, BK13, BK14, and BK15 on the color filter layer CFL.

Figure 8D:
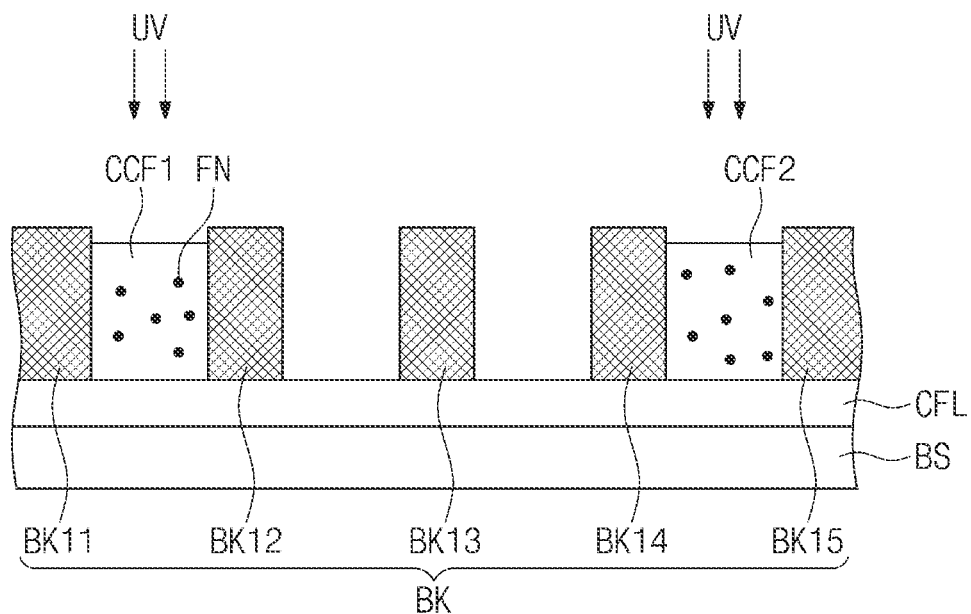

Referring to FIGS. 7 and 8D, the forming of light control portions CCF1 and CCF2 (S400) may include forming the light control portion CCF1 between the eleventh and twelfth banks BK11 and BK12 and forming the light control portion CCF2 between the fourteenth and fifteenth banks BK14 and BK15. The light control portions CCF1 and CCF2 may include a base resin and a functional material FN. The functional material FN may include at least one of the scattering particles and the quantum dots. The light control portions CCF1 and CCF2 may be obtained by irradiating an ultraviolet light UV to cure the ink provided through the inkjet method.

Figure 8E:
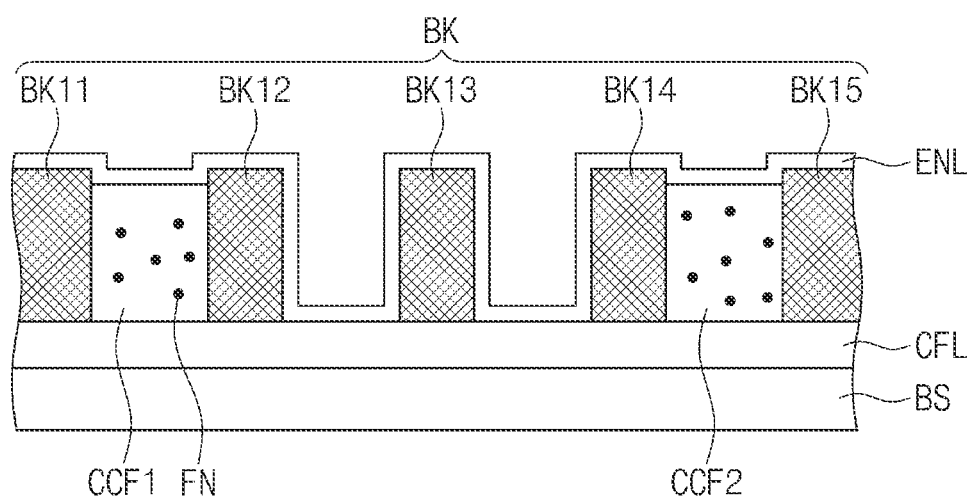

Referring to FIGS. 7 and 8E, after the forming of the light control portions CCF1 and CCF2, a process of forming the capping layer ENL on the light control portions CCF1 and CCF2 and the banks BK may be further performed.

The capping layer ENL may protect the light control portions CCF1 and CCF2 from external oxygen and/or moisture.

Figure 8F:
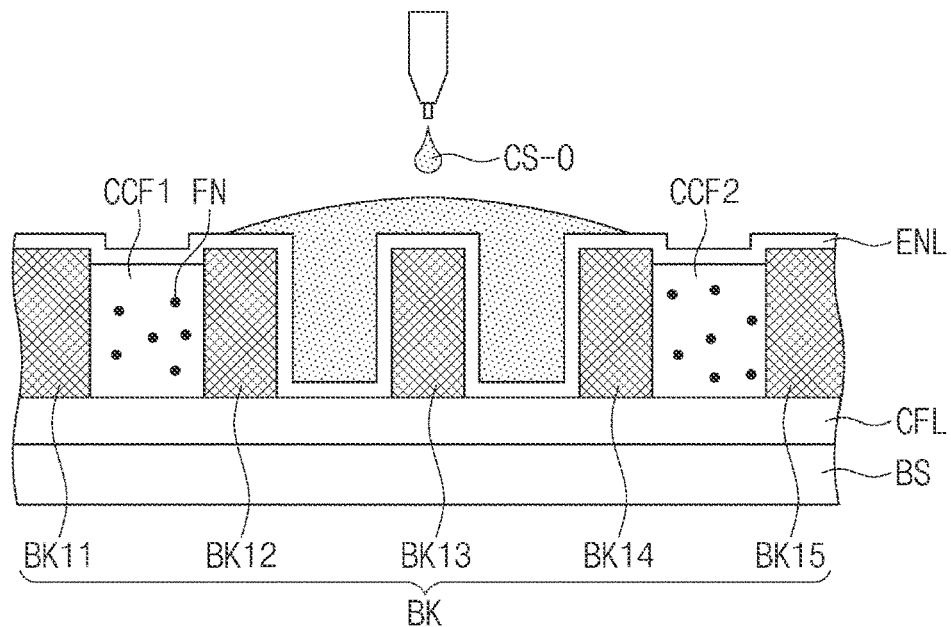
Figure 8G:
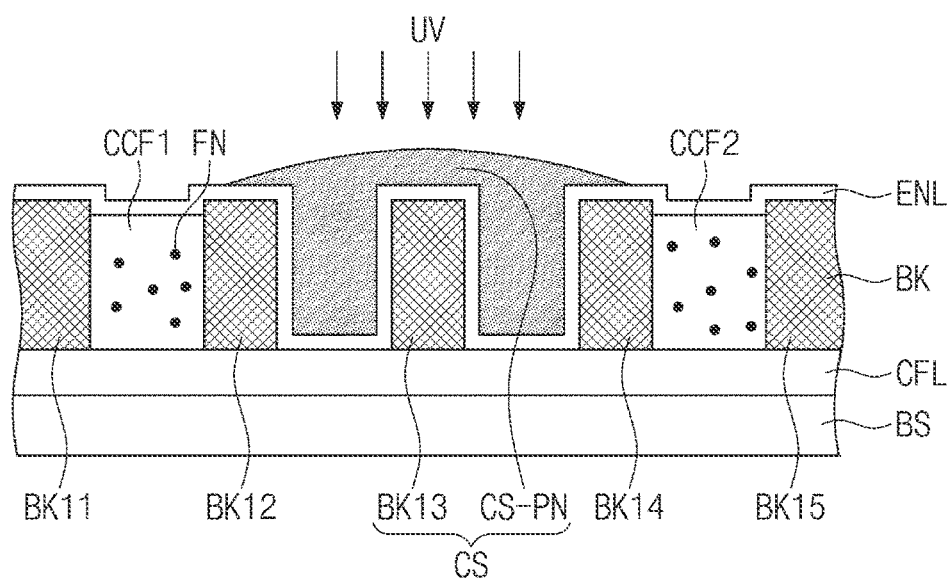

Referring to FIGS. 7, 8F, and 8G, the providing and curing of the organic composition CS-O between some banks among the banks BK to form the organic material pattern PN (S500) may include forming the organic composition CS-O to cover the twelfth, thirteenth, and fourteenth banks BK12, BK13, and BK14. The organic composition CS-O may overlap the twelfth, thirteenth, and fourteenth banks BK12, BK13, and BK14 and may not overlap the light control portions CCF1 and CCF2.

The organic composition CS-O may include at least one of the light blocking material and the resin, however, the exemplary embodiment should not be limited thereto or thereby. The organic composition CS-O may further include a curing initiator. The organic composition CS-O may be cured by the ultraviolet light UV irradiated thereto. The cured organic composition CS-O may form the organic material pattern PN. The organic material pattern PN may overlap the twelfth, thirteenth, and fourteenth banks BK12, BK13, and BK14 and may not overlap the light control portions CCF1 and CCF2.

The thirteenth bank BK13 may be the bridge bank BK-C described above. The organic material pattern PN overlapping the thirteenth bank BK13 may be the bridge pattern CS-PN (refer to FIG. 3C). The column spacer CS that includes the thirteenth bank BK13 and the bridge pattern CS-PN may be formed by curing the organic composition CS-O.

Figure 8H:
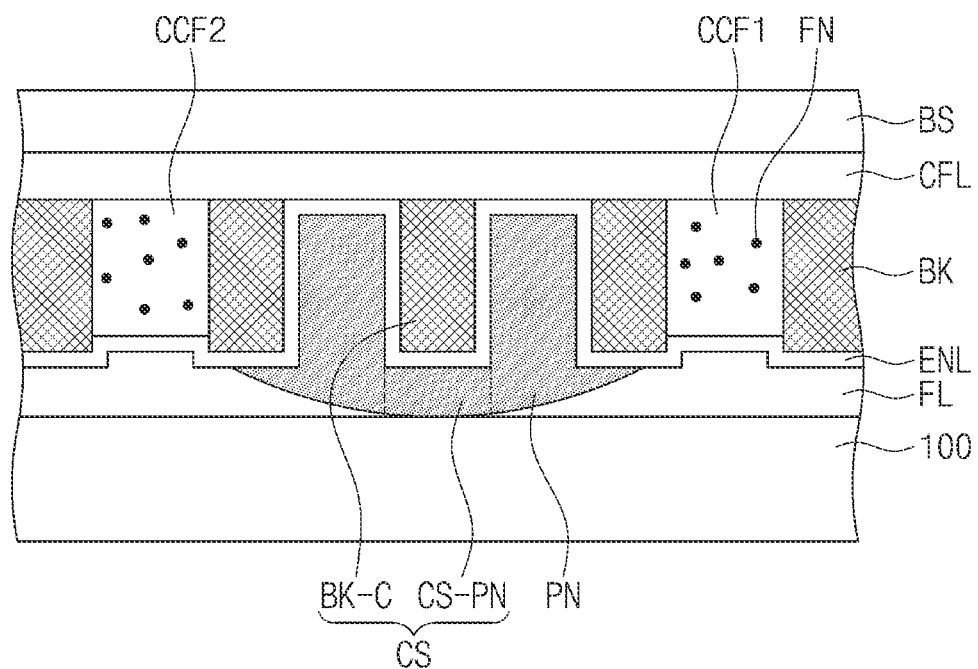

Referring to FIGS. 7 and 8H, a process of attaching the lower display substrate 100 to the upper display substrate 200 may be further performed after the forming of the organic material pattern PN (S500). An adhesive layer FL may be disposed between the lower display substrate 100 and the upper display substrate 200. The adhesive layer FL may include an organic material or an inorganic material.

The column spacer CS may have the insulating property and the elasticity, and thus, the gap between the lower display substrate 100 and the upper display substrate 200 may be maintained. The lower display substrate 100 in FIG. 8H may be substantially the same as the lower display substrate 100 described with reference to FIG. 3B.

According to the manufacturing method of the display panel, the organic material pattern may be provided on the bridge bank to allow the bridge bank and the bridge pattern to serve as the column spacer. Since the column spacer is not formed separately, the space may be secured in the display panel, and thus, the defects caused by mis-ejection of the ink may be prevented due to the secured space. The column spacer may maintain the gap between the upper display substrate and the lower display substrate and may have improved reliability.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present inventive concept shall be determined according to the attached claims.

What is claimed is:

1. A display panel comprising:
   an upper display substrate comprising a first pixel area, a second pixel area, a third pixel area, and a light blocking area surrounding the first, second, and third pixel areas; and
   a lower display substrate comprising a light emitting element,
   wherein the upper display substrate comprises:
   a base substrate;
   a first bank overlapping the light blocking area and disposed on the base substrate;
   a second bank overlapping the light blocking area and disposed on the base substrate;
   a bridge bank overlapping the light blocking area and disposed on the base substrate between the first bank and the second bank; and
   an organic material pattern, at least a portion of the organic material pattern being disposed on the bridge bank.

2. The display panel of claim 1, wherein the organic material pattern is disposed between the first bank and the second bank and covers the bridge bank.

3. The display panel of claim 1, wherein the at least a portion of the organic material pattern disposed on the bridge bank completely overlaps the bridge bank in a plan view.

4. The display panel of claim 1, further comprising a light control portion that overlaps the first pixel area and is disposed adjacent to the first bank in a plan view,
   wherein the light control portion comprises at least one of a scattering particle and a quantum dot.

5. The display panel of claim 4, wherein the organic material pattern overlaps the first bank, the bridge bank, and the second bank and does not overlap the light control portion.

6. The display panel of claim 4, wherein the light control portion includes a light transmitting layer that is capable of transmitting source light generated by the light emitting element or light conversion layer that is capable of converting a wavelength of the source light.

7. The display panel of claim 1, wherein a portion of the organic material pattern which overlaps the bridge bank is disposed closest to the lower display substrate.

8. The display panel of claim 1, further comprising a capping layer disposed between the bridge bank and the organic material pattern.

9. The display panel of claim 1, wherein the organic material pattern comprises a light blocking material or a resin.

10. The display panel of claim 1, wherein the upper display substrate further comprises a color filter layer disposed between the base substrate and the first bank, and the color filter layer comprises:
    a first color filter overlapping the first pixel area;
    a second color filter overlapping the second pixel area; and
    a third color filter overlapping the third pixel area.

11. The display panel of claim 1, further comprising:
    a third bank overlapping the light blocking area and disposed on the base substrate;
    a fourth bank overlapping the light blocking area and disposed on the base substrate; and
    a non-bridge bank overlapping the light blocking area and disposed between the third bank and the fourth bank, wherein the non-bridge bank does not overlap the organic material pattern.

12. The display panel of claim 1, further comprising:
    a third bank overlapping the light blocking area and disposed on the base substrate; and
    a fourth bank overlapping the light blocking area and disposed on the base substrate,
    wherein the organic material pattern is disposed between the third bank and the fourth bank, and the organic material pattern has a height lower than a height of each of the third bank and the fourth bank.

13. The display panel of claim 1, wherein the upper display substrate comprises:
    a display area that overlaps the first, the second, and the third pixel areas and the light blocking area; and
    a non-display area surrounding the display area, and
    wherein the organic material pattern overlaps the display area.

14. The display panel of claim 1, wherein the light emitting element includes a light emitting layer which is capable of emitting blue light.

15. The display panel of claim 1, wherein the first pixel area, the second pixel area, and the third pixel area provide red light, green light, and blue light, respectively.

16. A method of manufacturing a display panel, comprising:
    preparing an upper display substrate; and
    preparing a lower display substrate;
    wherein the preparing the upper display substrate comprises:
    preparing a base substrate;
    forming a color filter layer on the base substrate;
    forming a plurality of banks on the color filter layer;
    forming a light control portion in an area corresponds to a pixel area disposed between adjacent banks;
    providing an organic composition on a bank disposed in a non-pixel area; and
    curing the organic composition to form an organic material pattern.

17. The method of claim 16, further comprising forming a capping layer on the light control portion and the banks after the forming of the light control portion.

18. The method of claim 16, wherein the organic composition comprises a light blocking material or a resin.

19. The method of claim 16, further comprising attaching the lower display substrate to the upper display substrate after the forming of the organic material pattern.

20. The method of claim 19, wherein the lower display substrate comprises a light emitting element and the light emitting element is capable of emitting blue light.

* * * * *